United States Patent
Boettiger et al.

(10) Patent No.: US 6,905,975 B2
(45) Date of Patent: Jun. 14, 2005

(54) METHODS OF FORMING PATTERNED COMPOSITIONS

(75) Inventors: Ulrich C. Boettiger, Boise, ID (US); Scott L. Light, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 166 days.

(21) Appl. No.: 10/613,193

(22) Filed: Jul. 3, 2003

(65) Prior Publication Data

US 2005/0000936 A1 Jan. 6, 2005

(51) Int. Cl.[7] .................... H01L 21/302; H01L 21/311
(52) U.S. Cl. .................... 438/745; 438/694; 438/699
(58) Field of Search .................... 438/745, 694, 438/699, 942; 216/41; 430/5

(56) References Cited

U.S. PATENT DOCUMENTS

| | | | | |
|---|---|---|---|---|
| 4,088,490 A | * | 5/1978 | Duke et al. | .................. 430/312 |
| 6,033,952 A | | 3/2000 | Yasumura et al. | |
| 6,270,929 B1 | | 8/2001 | Lyons et al. | |
| 6,274,289 B1 | * | 8/2001 | Subramanian et al. | ... 430/273.1 |
| 6,383,952 B1 | | 5/2002 | Subramanian et al. | |
| 6,440,799 B1 | | 8/2002 | Trivedi | |
| 6,486,058 B1 | * | 11/2002 | Chun | .......................... 438/637 |
| 6,492,075 B1 | * | 12/2002 | Templeton et al. | ............ 430/5 |
| 2002/0119397 A1 | * | 8/2002 | Rolfson | ..................... 430/312 |
| 2003/0162106 A1 | * | 8/2003 | Rolfson | ........................ 430/5 |
| 2004/0018450 A1 | * | 1/2004 | Fang et al. | ................. 430/313 |

* cited by examiner

Primary Examiner—Alexander Ghyka
(74) Attorney, Agent, or Firm—Wells St. John P.S.

(57) ABSTRACT

The invention includes methods by which the size and shape of photoresist-containing masking compositions can be selectively controlled after development of the photoresist. For instance, photoresist features can be formed over a substrate utilizing a photolithographic process. Subsequently, at least some of the photoresist features can be exposed to actinic radiation to cause release of a substance from the photoresist. A layer of material is formed over the photoresist features and over gaps between the features. The material has a solubility in a solvent which is reduced when the material interacts with the substance released from the photoresist. The solvent is utilized to remove portions of the material which are not sufficiently proximate to the photoresist to receive the substance, selectively relative to portions which are sufficiently proximate to the photoresist. The photoresist features can be exposed to the actinic radiation either before or after forming the layer of material.

44 Claims, 9 Drawing Sheets

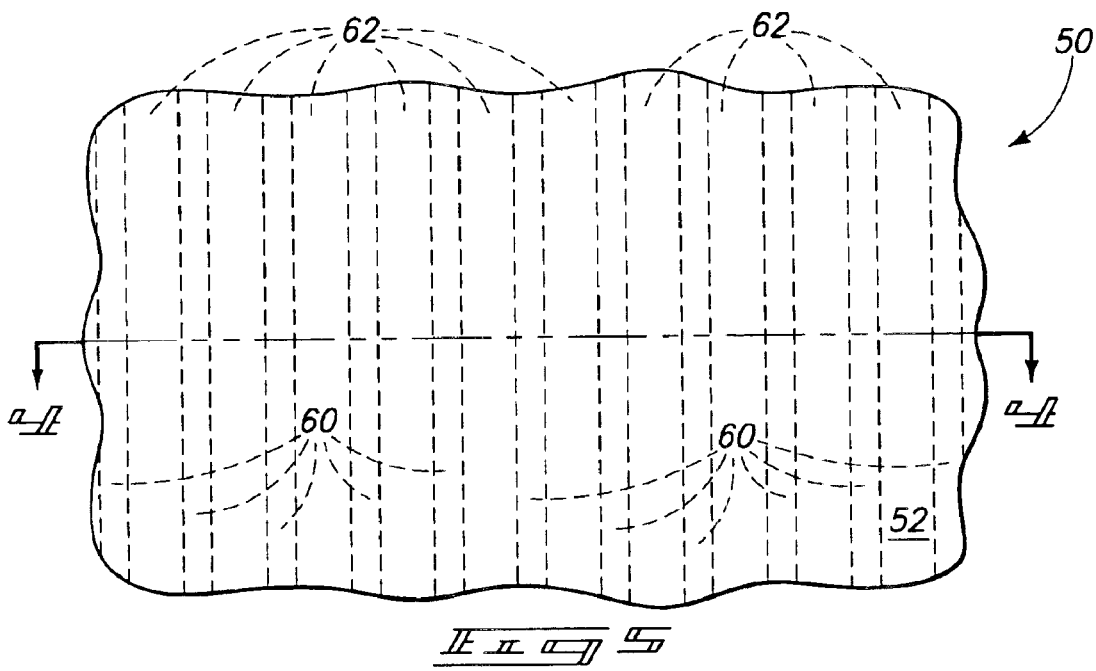
_Fig 5_
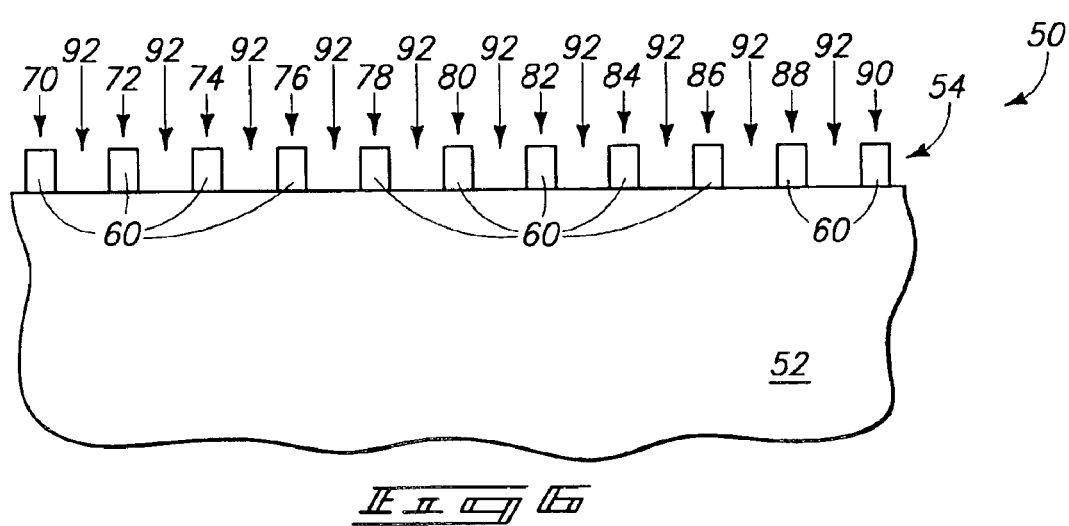
_Fig 6_

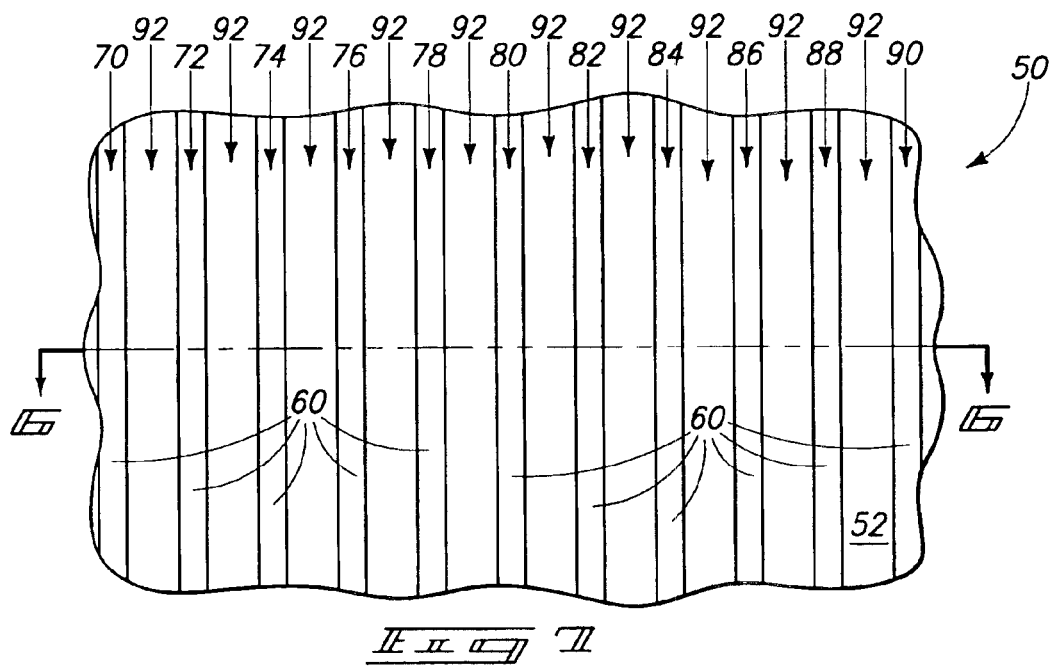
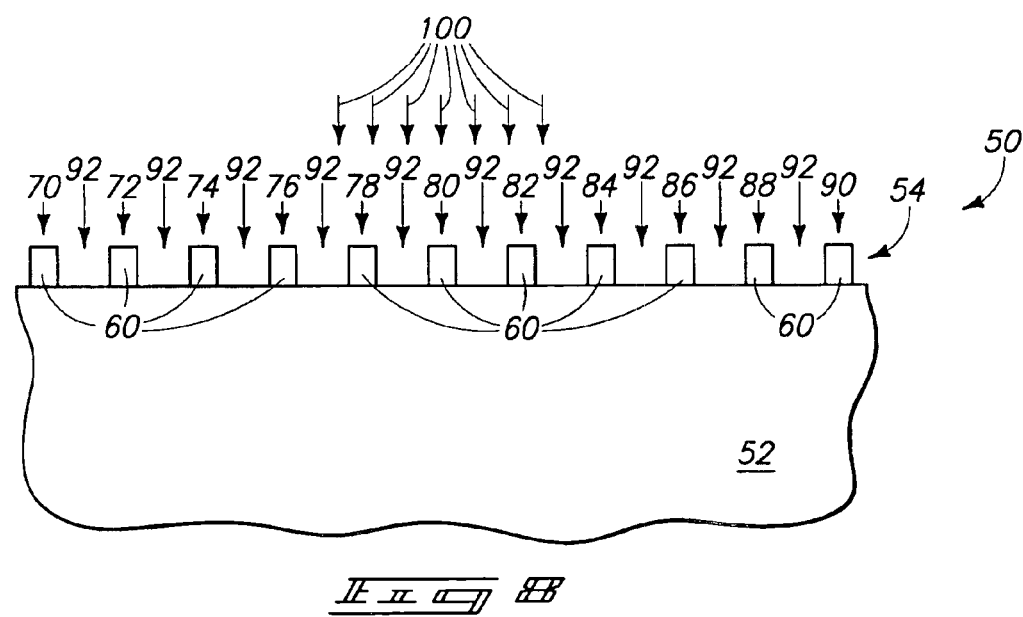

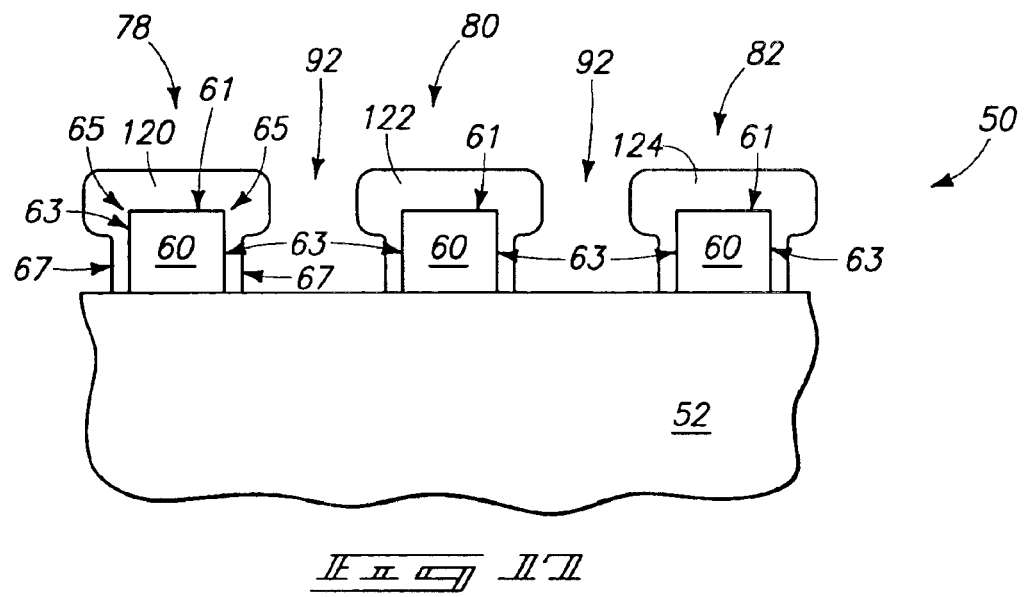
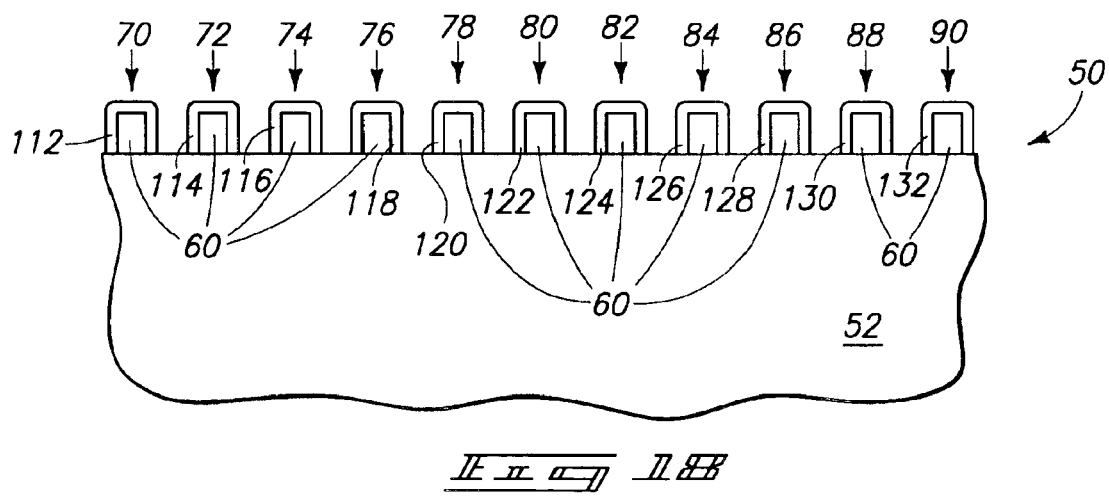

METHODS OF FORMING PATTERNED COMPOSITIONS

TECHNICAL FIELD

The invention pertains to methods of forming patterned compositions, and in particular aspects pertains to methods of forming photoresist-containing patterns over semiconductor materials.

BACKGROUND OF THE INVENTION

A typical method of forming a pattern over a semiconductor substrate is to utilize photolithographic processing to form a patterned mask of photoresist over the substrate. FIG. 1 shows a prior art construction 10 comprising a substrate 12 and several patterned blocks 14 of photoresist formed over substrate 12. The patterned blocks are separated from one another by gaps 15.

Substrate 12 can comprise, for example, a monocrystalline silicon wafer. To aid in interpretation of this disclosure and the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Patterned blocks 14 can be formed by first providing a layer of photoresist across an entirety of an upper surface of substrate 12, exposing the photoresist to patterned actinic radiation which renders some portions of the photoresist more soluble in a developing solvent than other portions, and subsequently utilizing the developing solvent to remove portions of the photoresist and leave the blocks 14 of the resist remaining over substrate 12. The actinic radiation can be, for example, ultraviolet light. The developing solvent can be any appropriate fluid (typically liquid) utilized for developing a pattern in the photoresist after exposure of the photoresist to actinic radiation. The term "developing solvent" thus encompasses any developer solution, including dissolving agents, organic solvents, etc.

Photoresist blocks 14 define a mask, and such mask can be utilized for patterning underlying substrate 12. Specifically, the substrate 12 can be subjected to an etch while the patterned mask comprising blocks 14 protects various regions of substrate 12, and accordingly openings will be formed selectively in regions of substrate 12 which are not protected by one of the patterned blocks 14.

A continuing goal in semiconductor device processing is to decrease dimensions of devices, and thereby conserve valuable semiconductor substrate real estate. A minimum distance between adjacent blocks 14 is constrained by parameters utilized in the photolithographic process. Accordingly, various procedures have been developed which can reduce a dimension of a gap between adjacent features of a photoresist mask, and which can thereby be utilized to reduce the size of features patterned utilizing the mask. An exemplary process which can be utilized to reduce the size of a gap between adjacent features of a photoresist mask is described with reference to FIGS. 2 and 3.

Referring to FIG. 2, a material 16 is provided over and between the discrete blocks 14 of the patterned photoresist mask. Material 16 can comprise an AZ R composition available from Clariant International, Ltd, such as, for example, the compositions designated as AZ R200™, AZ R500™, and AZ R600™. Such composition can be spin coated across an entirety of the upper surface of a semiconductor wafer, and is shown coated across the entirety of fragment 10. The material is utilized with chemically-amplified resist, and specifically is utilized with resist having a photogenerated acid therein. The semiconductor wafer having material 16 thereover is baked at a temperature from about 100° C. to about 120° C. Such baking diffuses acid from resist 14 into the material 16, to form chemical crosslinks within portions of the material 16 that are proximate to the various masses 14. Such causes portions of material 16 in contact with resist blocks 14 to be selectively hardened relative to other portions of material 16 that are not sufficiently proximate to the resist blocks.

Referring to FIG. 3, material 16 is subjected to conditions which selectively remove the portions of the material which have not had chemical crosslinks formed therein, while leaving the material that is in contact with photoresist masses 14 (i.e., the portions which have had chemical crosslinks formed therein). Such removal can be accomplished by exposing fragment 10 to an appropriate solvent, such as, for example, 10% isopropyl alcohol in deionized water, or a solution marketed as "SOLUTION C™" by Clariant International, Ltd.

In applications in which AZ R200™, AZ R500™, or AZ R600™ is utilized, fragment 10 can be subjected to a so-called hard bake at a temperature of from about 100° C. to about 140° C. after removal of the non-crosslinked material. Such hard bake can fully dry and further crosslink the portions of material 16 remaining associated with photoresist blocks 14.

The material 16 remaining around blocks 14 increases a size of the features of the patterned mask. In other words, photoresist blocks 14 together with crosslinked material 16 form a patterned composition over substrate 12, with such composition having discrete masking features 18 separated by gaps 20. The gaps 20 are smaller than the gaps 15 that had originally been present between blocks 14 of FIG. 1. The smaller gaps 20 can enable smaller openings to be patterned into substrate 12 than could be patterned with the photoresist blocks 14 alone, which can enable fabrication of smaller circuit device components relative to the size of the components which would be formed utilizing photoresist blocks 14 alone.

The processing of FIGS. 2 and 3 can provide a significant improvement relative to processes which utilize photoresist alone. It would be desirable to develop further improvements of methodologies for forming patterned masking compositions, and in particular it would be desirable to develop improvements enabling selective control of the thickness associated with the features of a patterned masking composition.

SUMMARY OF THE INVENTION

In one aspect, the invention encompasses a method in which a substrate is provided having photoresist thereover. The photoresist is in a pattern comprising a pair of physically separate features. A region of the photoresist is exposed to actinic radiation to alter at least one property of the photoresist. A layer of material is formed over the features and over a gap between the features. The material has a solubility in a developing solvent which is reduced when the material is proximate the altered photoresist. The layer of material is subsequently exposed to the solvent to selectively remove a portion of the material which is not proximate the region of altered photoresist relative to a portion of the material which is proximate the altered photoresist.

In one aspect, the invention encompasses a method wherein photoresist is formed over a substrate and subjected to first actinic radiation to render a first region of the photoresist more soluble in a first solvent than a second region. The first solvent is subsequently utilized to remove the first region of the photoresist while leaving the second region. The second region of the photoresist is then exposed to second actinic radiation, and the photoresist of the second region releases a substance in response to the exposure to the second actinic radiation. A material is formed over the second region of the photoresist. The material is rendered less soluble in a second solvent through interaction with the substance released from the photoresist. The second solvent is then utilized to selectively remove a portion of the material which is not proximate the photoresist relative to a portion of material which is proximate the photoresist.

BRIEF DESCRIPTION OF THE DRAWINGS

Preferred embodiments of the invention are described below with reference to the following accompanying drawings.

FIG. 5 is a top view of a portion of the semiconductor wafer substrate comprising the fragment of FIG. 4 along the line 4—4.

FIG. 6 is a view along the cross section of FIG. 4, showing the FIG. 4 wafer fragment at a processing stage subsequent to that of FIG. 4.

FIG. 7 is a top view of a portion of the semiconductor wafer comprising the fragment of FIG. 6 along the line 6—6.

FIG. 8 is a view along the cross section of FIG. 4, showing the FIG. 4 wafer fragment at a processing stage subsequent to that of FIG. 6.

FIG. 17 is an expanded view of a portion of the FIG. 4 wafer fragment shown at a processing stage subsequent to that of FIG. 15 in accordance with a third aspect of the invention.

FIG. 18 is a view of the FIG. 4 wafer fragment shown at a processing stage similar to that of FIG. 12, in accordance with a fourth aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In particular aspects, the present invention enables selective control of the size and shape of resist-containing features after development of the resist. The resist feature manipulations can be incorporated into improvements in semiconductor fabrication processes. Such improvements can include, for example, locally selectable control of the growth size of resist features or feature parts, even when such parts have roughly the minimum feature size available at the maximum resolution achievable with a particular photolithographic tool and process; control of the size of particular features with nanometer accuracy; adjustment of feature critical dimensions in a feed forward process, which can utilize, for example, critical dimension measurement after photoresist development, and subsequent modification of the critical dimension across part of a wafer, or alternatively all of a wafer, utilizing methodology of the present invention; and selective formation of variable overhang structures, such as can be used in, for example, lift-off processes or self-aligned implants with tapered dose profiles. If methodology of the present invention is utilized to adjust feature critical dimensions in a feed forward process, such dimensions can be adjusted uniformly across a wafer, uniformly across a particular die associated with the wafer, and/or in specifically selected local areas to compensate for particular non-uniformities, such as, for example, to compensate for wafer and/or die non-uniformities.

Figure 4:
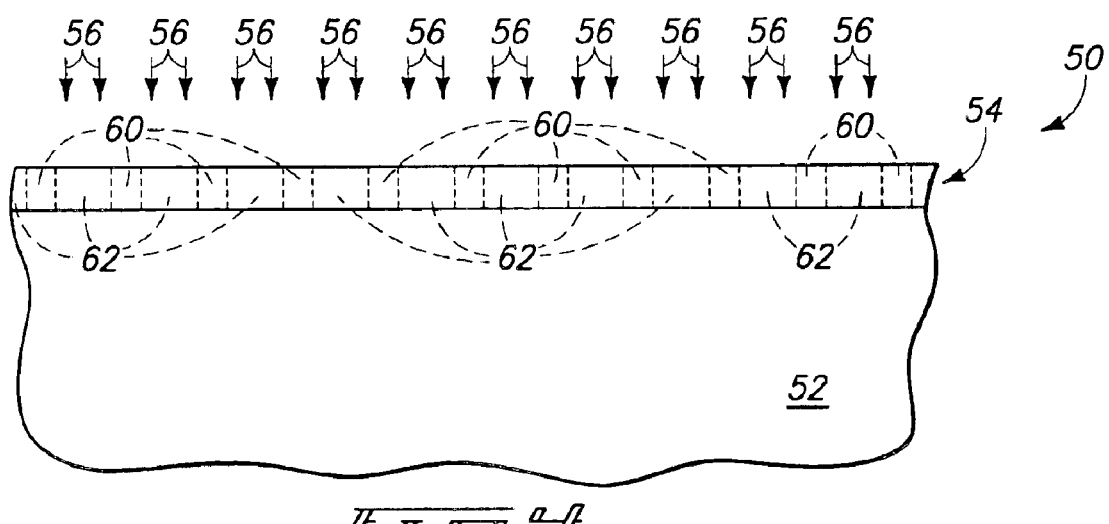
FIG. 4 is a view of a semiconductor wafer fragment shown at a preliminary processing stage in accordance with an exemplary method of the present invention.

An exemplary process of the present invention is described with reference to FIGS. 4–13. Referring initially to FIG. 4, such illustrates a semiconductor wafer fragment 50 comprising a substrate 52 having a layer of photoresist 54 formed thereover. Substrate 52 can comprise, for example, a semiconductor substrate similar to the substrate 12 described previously with reference to the prior art. In particular aspects, substrate 52 can comprise a monocrystalline silicon wafer having various materials or layers supported thereover (not shown) which ultimately are to be patterned with a mask derived from photoresist layer 54.

A pattern of actinic radiation 56 is shown directed toward photoresist 54. The patterned actinic radiation can be formed by passing suitable radiation through a photomask. The patterned radiation divides the photoresist into first regions 60 and second regions 62. Specifically, the actinic radiation strikes the second regions 62, and does not impact the first regions 60, and such alters the relative solubility of first regions 60 and second regions 62 in a developing solution. The radiation can render second region 62 to be more soluble in a developing solution, or less soluble, depending on whether the photoresist is a positive or negative resist.

Regardless of whether the resist is a positive or negative resist, the resist will typically be a chemically amplified resist. Accordingly, the resist will release a substance (i.e., the chemical utilized for the chemical amplification) in response to the exposure to the actinic radiation, and such substance will amplify the effect of the actinic radiation. In particular aspects, the substance released by the radiation can be a photogenerated acid, and a proton from such acid can be the chemical which amplifies the effect of the radiation. The chemical amplification may occur for a period of time after the exposure to the actinic radiation, and in some aspects the temperature of the resist can be increased for a period of time following the exposure to the radiation (a so-called "bake") to enhance the chemical amplification.

FIG. 5 is a top view of the FIG. 4 structure, and shows the regions 60 and 62 alternating across an upper surface of the structure. The actinic radiation 56 is not shown in the top view of FIG. 5 to simplify the illustration. Although regions 60 are shown with narrower widths than regions 62, it is to be understood that regions 60 can be wider than regions 62, or about the same width as regions 62 in other embodiments (not shown).

Referring to FIG. 6, second regions 62 (FIG. 4) are selectively removed relative to first regions 60 utilizing a developer solution, and such forms a patterned mask of photoresist material 54 over an upper surface of substrate 52. Although the regions exposed to the actinic radiation (second regions 62 of FIG. 4) have been selectively removed relative to the regions which were not exposed to the radiation (first regions 60), it is to be understood that the first regions could alternatively have been selectively removed, depending on whether the resist is a positive resist or a negative resist.

The first regions 60 remaining in FIG. 6 correspond to a plurality of physically separate features 70, 72, 74, 76, 78, 80, 82, 84, 86, 88 and 90. The physically separate resist features can be considered to be discrete relative to one another, and are separated by gaps 92. Various of the features can be considered to be paired adjacent features. For instance, features 70 and 72 can be considered to be paired adjacent features, as can features 72 and 74, etc.

FIG. 7 is a top view of the FIG. 6 structure, and shows the features 70, 72, 74, 76, 78, 80, 82, 84, 86, 88 and 90 extending across an upper surface of substrate 52 as lines. It is to be understood that the features can comprise other shapes (not shown) in various aspects of the invention.

Figure 9:
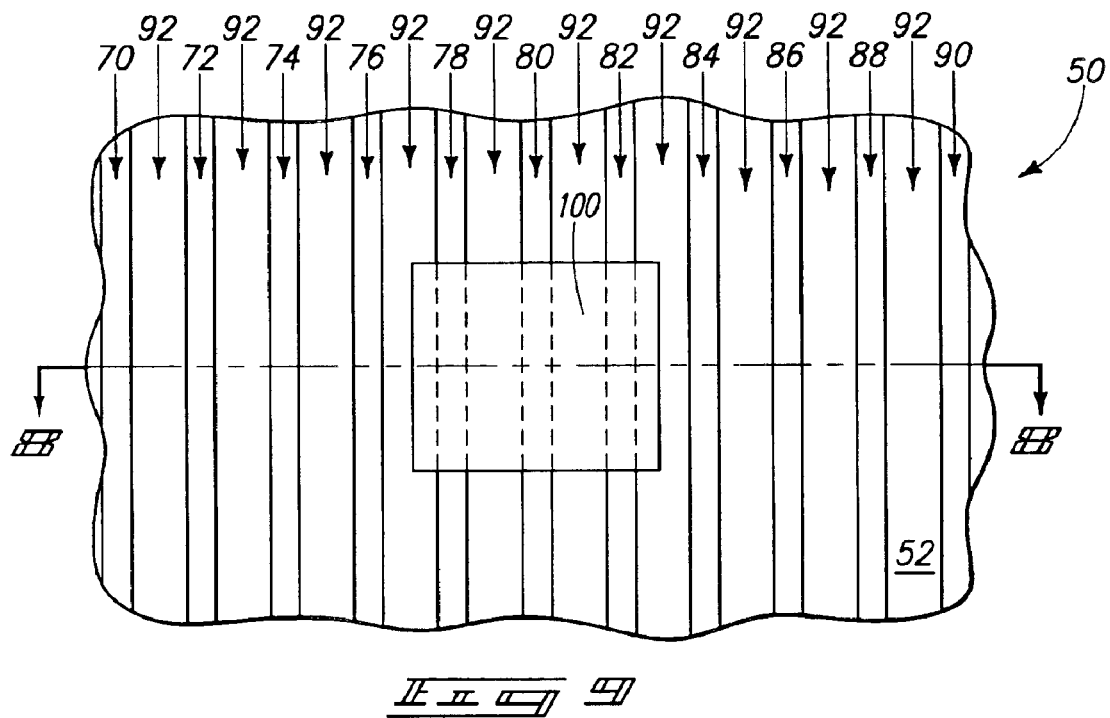
FIG. 9 is a top view of a portion of the semiconductor wafer comprising the fragment of FIG. 8 along the line 8—8.

FIGS. 8 and 9 show construction 50 at a processing stage subsequent to that of FIGS. 6 and 7. Specifically, features 78, 80 and 82 are exposed to actinic radiation 100 to release one or more substances from the photoresist of the features. Actinic radiation 100 can be referred to as second actinic radiation to distinguish it from the first actinic radiation 56 utilized in FIG. 4. The second actinic radiation and the first actinic radiation can be light, and in particular aspects can be identical in dose and primary wavelength relative to one another. In other aspects, the first and second actinic radiation can differ in dose and/or primary wavelength relative to one another. The term "primary wavelength" is utilized to refer to the predominant wavelength of the radiation.

One exemplary reason for having the second actinic radiation different from the first actinic radiation is to enable the profile of the second actinic radiation to be tailored to be different than the first actinic radiation. Such tailoring can, for example, enable strong absorption of the second actinic radiation to occur only at selected regions of photoresist (to form, for example, the structure described below with reference to FIG. 17). Another exemplary reason for having the second actinic radiation different from the first actinic radiation is to enable a selective response of the photoresist to the first and second radiations. For instance, the photoresist could be formulated to contain a substance which responds only to the second radiation, in addition to the substance which responds to the first radiation. The photoresist could then be patterned with the first radiation, and then be very specifically and selectively further patterned with the second radiation. There can, of course, also be advantages to having the second actinic radiation be identical to the first actinic radiation, such as, for example, that both the first and second actinic radiation can then activate the same amplification materials in a photoresist.

Either or both of the first and second actinic radiations can comprise a constant dose or a variable dose. It can be advantageous to utilize a variable dose of the second actinic radiation to enable controlled adjustment of the amount of material formed over the exposed photoresist regions in the subsequent processing described below with reference to FIGS. 10–13.

In aspects in which the second actinic radiation 100 has a suitable wavelength to activate unused chemical amplification materials remaining within the photoresist after the exposure of FIG. 4, the one or more substances released in the photoresist during the exposure to the second actinic radiation 100 will typically include chemicals associated with chemical amplification of the resist. In particular aspects, such substances will comprise, consist essentially, or consist of photogenerated acids released by exposure of the resist features to the second actinic radiation. It is to be understood that the exposure to second actinic radiation 100 can be generally considered to alter at least one property of the photoresist exposed to such actinic radiation.

FIG. 9 schematically illustrates actinic radiation 100 as a block covering only portions of the exposed photoresist features 78, 80 and 82.

The amount of substance released from the photoresist at the processing of FIGS. 8 and 9 (for example, the amount of photogenerated acid formed) can be controlled by controlling the dose of second actinic radiation, and/or controlling the temperature of the photoresist during and/or after exposure to the second actinic radiation (for example, subjecting the photoresist to a bake of controlled temperature and duration after the exposure of the photoresist to the second actinic radiation).

Figure 10:
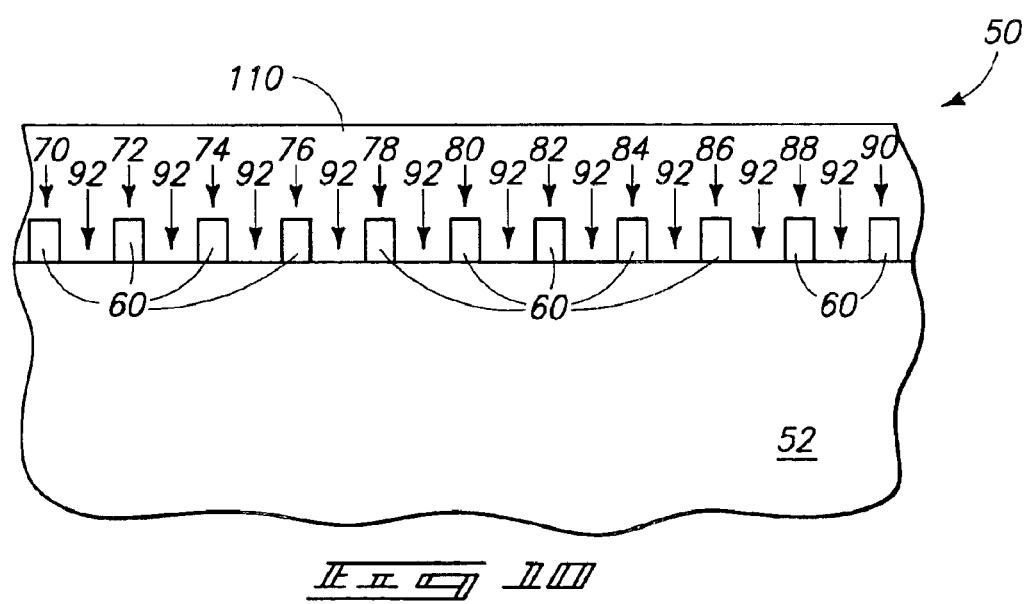
FIG. 10 is a view along the cross section of FIG. 4 showing the FIG. 4 wafer fragment at a processing stage subsequent to that of FIG. 8.
Figure 11:
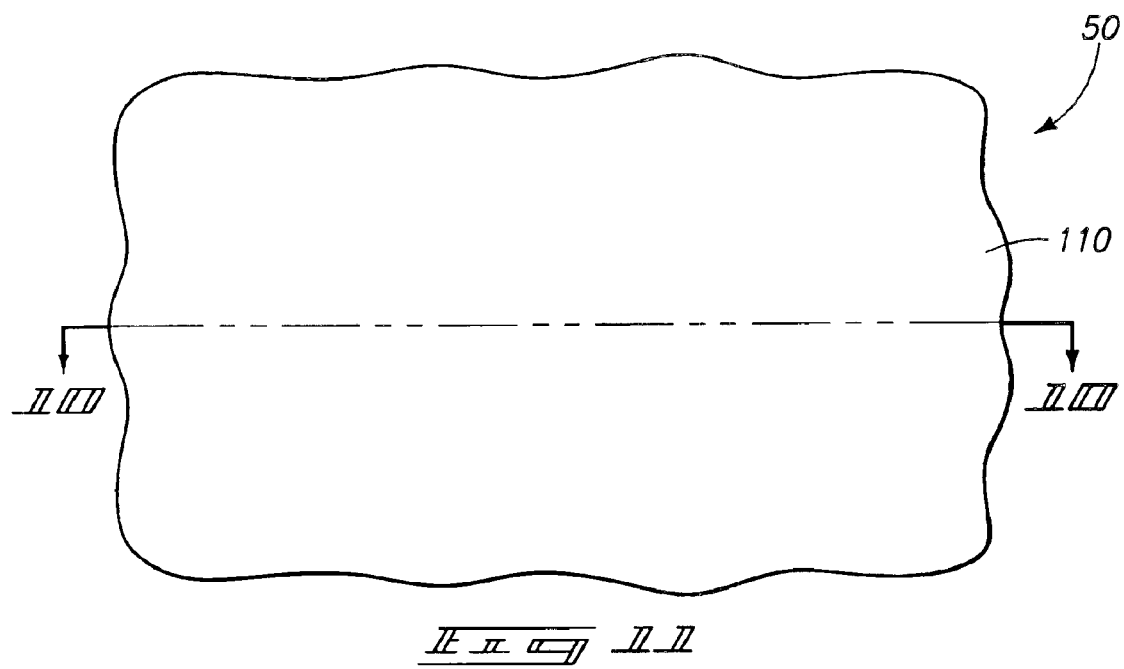
FIG. 11 is a top view showing a portion of the semiconductor wafer comprising the fragment of FIG. 10 along the line 10—10.

Referring to FIG. 10, a material 110 is provided over features 70, 72, 74, 76, 78, 80, 82, 84, 86, 88 and 90; and also within gaps 92. FIG. 11 shows material 110 entirely covering the illustrated portion of construction 50. Material 110 has a solubility in a solvent which is reduced when the material interacts with the one or more substances released from the photoresist during exposure to second actinic radiation 100. For instance, material 110 can correspond to one of the compositions designated as AZ R200™, AZ R500™ and AZ R600™ by Clariant International, Ltd. In such aspect, the substance released by exposure to the second actinic radiation can be a photogenerated acid, and a component of such acid (such as, for example, a proton) can diffuse into the material 110 to induce crosslinking within portions of material 110 which are proximate the photoresist that had been exposed to second actinic radiation 100. If material 110 corresponds to the composition designated as AZ R200™, AZ R500™ or AZ R600™, construction 50 can be subjected to a bake at a temperature of from about 100° C. to about 120° C. to diffuse released photogenerated acid, or a component thereof, from the photoresist into material 110.

Figure 12:
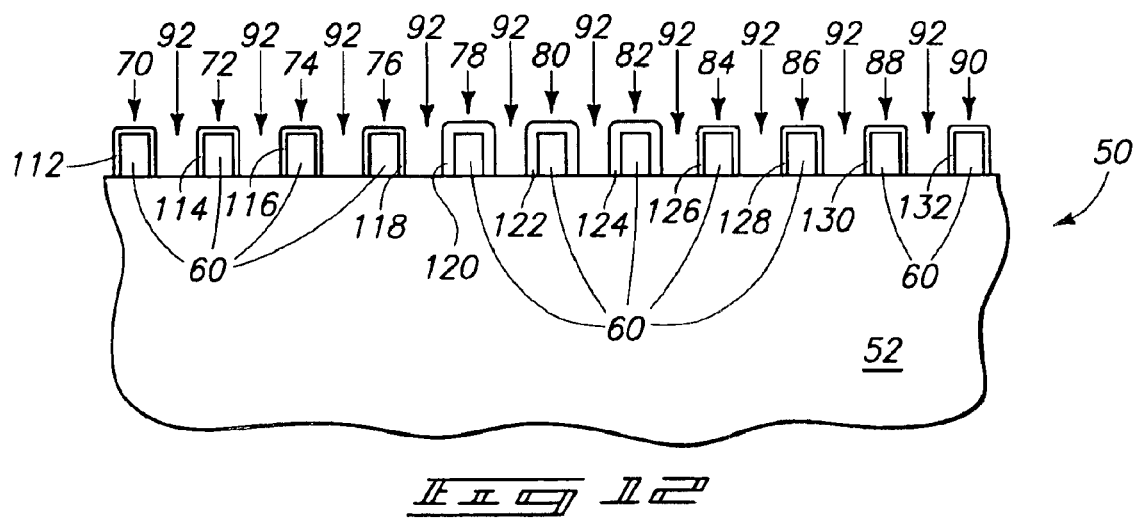
FIG. 12 is a view along the cross section of FIG. 4 showing the FIG. 4 wafer fragment at a processing stage subsequent to that of FIG. 10.
Figure 13:
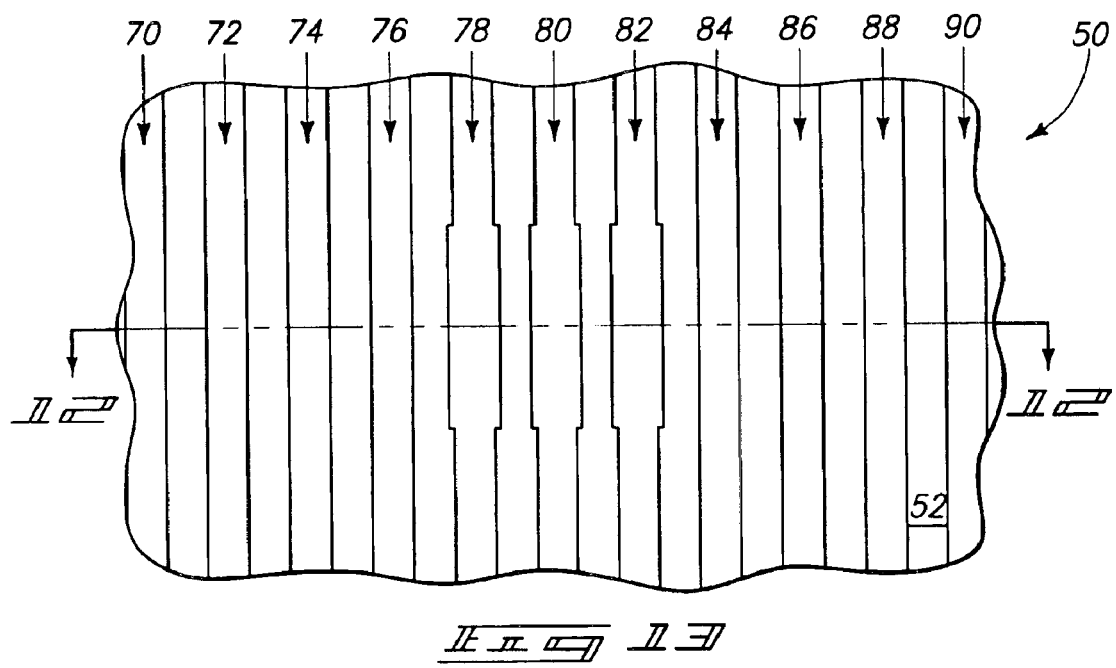
FIG. 13 is a top view of a portion of the semiconductor wafer comprising the FIG. 12 wafer fragment along the line 12—12.

Referring to FIGS. 12 and 13, construction 50 is illustrated after being exposed to an appropriate solvent to remove portions of material 110 (FIGS. 10 and 11) which are not proximate photoresist, and which therefore have not had substances released from the photoresist diffused therein (or otherwise been affected by altered properties of photoresist exposed to actinic radiation), relative to portions of material 110 that are sufficiently proximate the photoresist to be influenced by substances released from the photoresist. If material 110 comprises one of the compositions designated as AZ R200, AZ R500™ or AZ R600™ by Clariant International, Ltd., the solvent can comprise, for example, "SOLUTION C™", or diluted isopropyl alcohol, for example. The portions of material 110 remaining in FIG. 12 are in the form of layers 112, 114, 116, 118, 120, 122, 124, 126, 128, 130 and 132 formed over features 70, 72, 74, 76, 78, 80, 82, 84, 86, 88 and 90, respectively. The features comprising photoresist 60 in combination with the remaining portions of material (i.e., the layers of material shown in FIG. 12) can be considered to correspond to a patterned composition extending over substrate 52.

Figure 1:
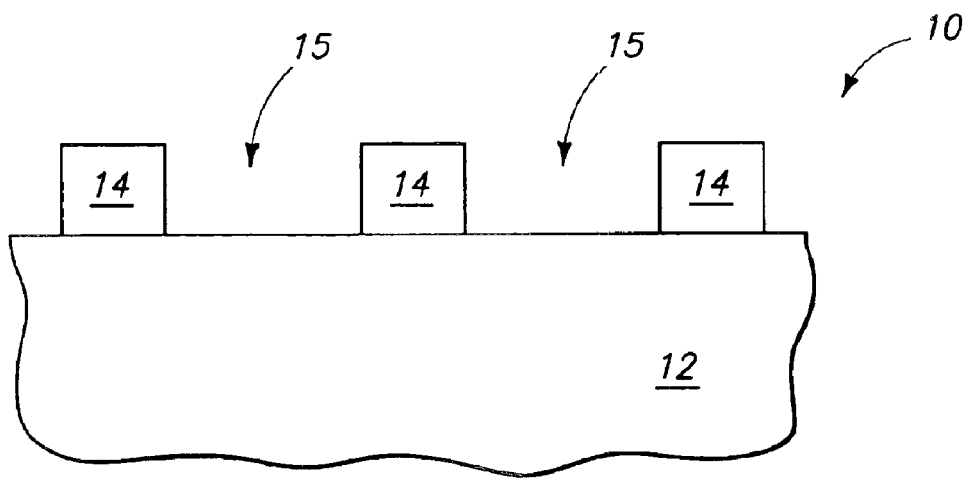
FIG. 1 is a diagrammatic, cross-sectional view of a semiconductor wafer fragment at a preliminary processing stage of a prior art method.
Figure 2:
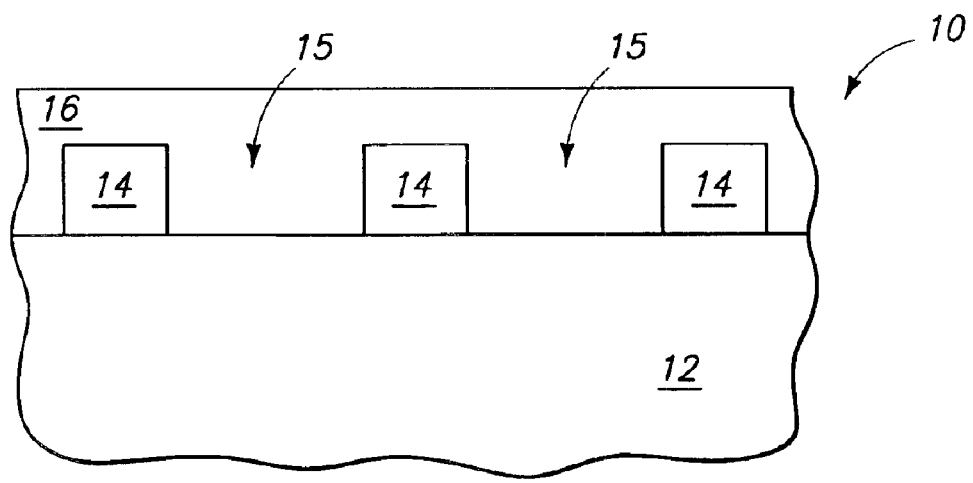
FIG. 2 is a view of the FIG. 1 wafer fragment shown at a prior art processing stage subsequent to that of FIG. 1.
Figure 3:
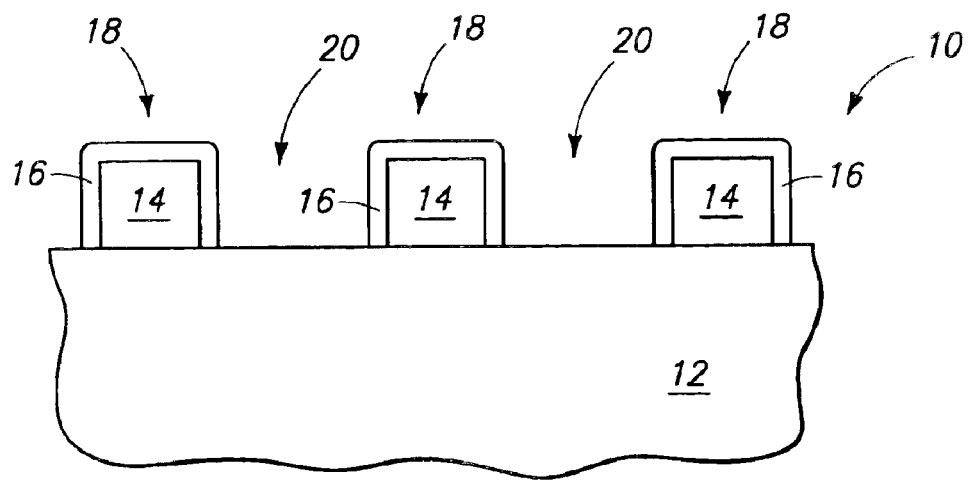
FIG. 3 is a view of the FIG. 1 wafer fragment shown at a prior art processing stage subsequent to that of FIG. 2.

The layers 112, 114, 116, 126, 128, 130 and 132 are relatively thin compared to layers 120, 122 and 124; and are formed from substances remaining in the photoresist from the exposure to the first actinic radiation 56. Accordingly, layers 112, 114, 116, 118, 126, 128, 130 and 132 correspond essentially to layers which can be formed by the prior art processing of FIGS. 2 and 3. In contrast, layers 120, 122 and 124 are thickened by the selective exposure of features 78, 80 and 82 to the second actinic radiation 100 (FIGS. 8 and 9). Such is a significant deviation from the prior art, in that the photoresist features have been subjected to actinic radiation after the initial patterning of the features, and such exposure has been utilized to selectively thicken a material subsequently crosslinked over the photoresist. The gaps 92 between layers 120, 122 and 124 (i.e., the gaps between adjacent features 78 and 80, and between adjacent features 80 and 82) are significantly smaller than the gaps between other layers, such as, for example, the gaps between layers 112 and 144 or layers 130 and 132. Further, the gap 92 between adjacent features 76 and 78 has an intermediate size relative to the large gap between adjacent features 70 and 72, and the small gap between adjacent features 78 and 80. The intermediate sized gap results from the exposure of only one of the adjacent features 76 and 78 to the second actinic radiation 100.

It is noted that the invention encompasses aspects (not shown) in which the first actinic radiation does not lead to formation of any layers from material 110, and in such aspects the only layers of material present at the processing stage of FIG. 12 would be layers 120, 122 and 124. It is more typical, however, for the photoresist exposed only to the first actinic radiation to form the shown narrow layers (layer 112, etc.). The narrow layers would have a measurable thickness, which can be, in particular aspects, a thickness greater than about 5 Å, and in some aspects can be a thickness greater than 50 Å.

FIG. 13 shows that the widened portions associated with features 78, 80 and 82 are only over the regions exposed to second actinic radiation 100 (FIG. 9).

Figure 14:
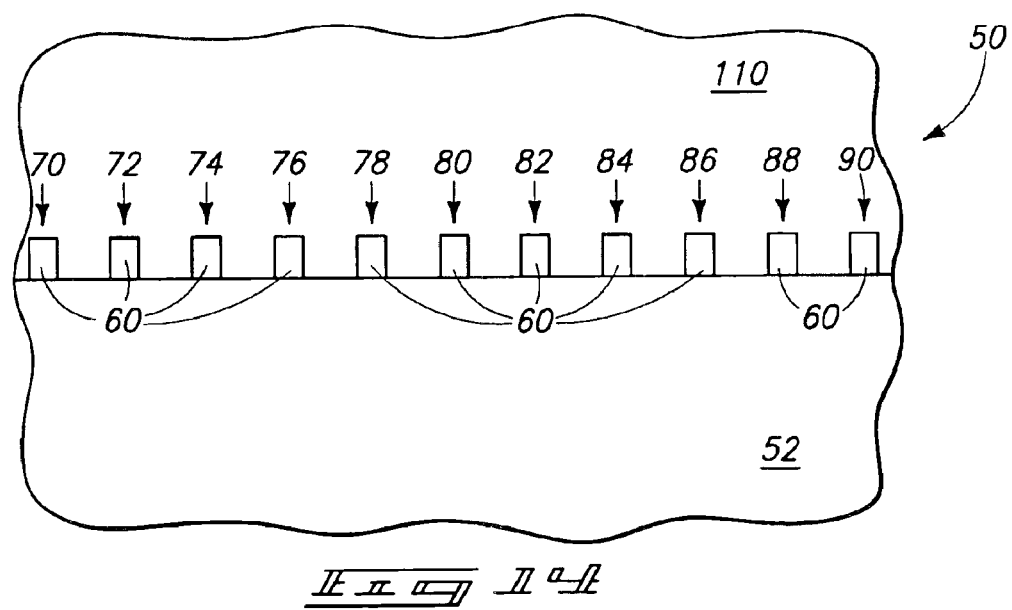
FIG. 14 is a view along the cross-section of FIG. 4 showing the FIG. 4 wafer fragment at a processing stage subsequent to that of FIG. 6 in accordance with a second aspect of the invention.
Figure 15:
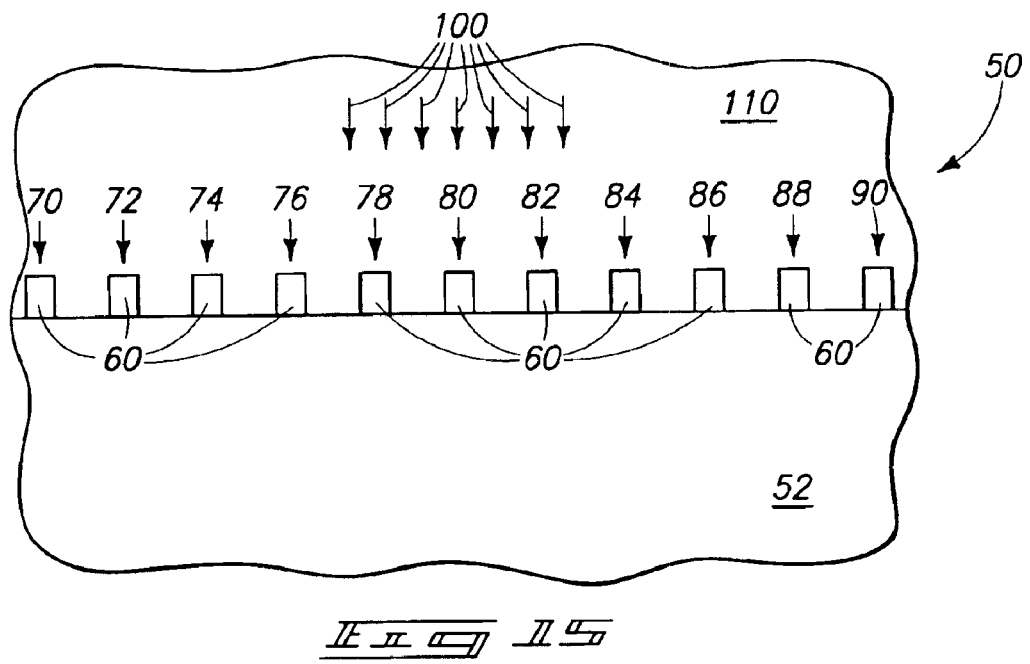
FIG. 15 is a view of the FIG. 4 wafer fragment shown at a processing stage subsequent to that of FIG. 14 in accordance with the second aspect of the invention.
Figure 16:
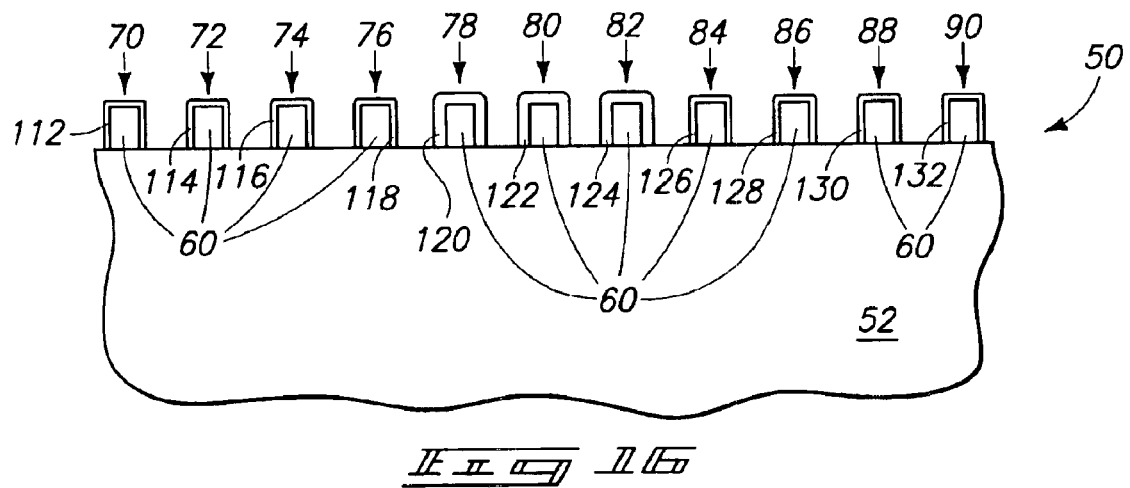
FIG. 16 is the view of the FIG. 4 wafer fragment shown at a processing stage subsequent to that of FIG. 15 in accordance with the second aspect of the invention.

Although the processing of FIGS. 4–13 comprises exposure to the second actinic radiation 100 (FIGS. 8 and 9) occurring before provision of the material 110 (FIGS. 10 and 11), it is to be understood that the order can be reversed if material 110 is suitably transparent to the actinic radiation 100. Such is illustrated in FIGS. 14–16. In referring to FIGS. 14–16, similar numbering will be utilized as was used above in describing FIGS. 4–13, where appropriate.

Referring to FIG. 14, construction 50 is shown at a processing stage subsequent to that of FIG. 6, and is shown with material 110 formed over features 72, 74, 76, 78, 80, 82, 84, 86, 88 and 90 of resist 60.

Referring to FIG. 15, features 78, 80 and 82 are exposed to actinic radiation 100 passing through material 110. It is noted that if material 110 comprises AZ R200™, AZ R500™ or AZ R600™, the above-described bake of the material at from about 100° C. to 120° C. can occur before exposure to actinic radiation 100 as well as during or after the exposure; or can occur only during and/or after the exposure to actinic radiation 100.

Referring to FIG. 16, construction 50 is illustrated after utilization of an appropriate solvent to remove portions of material 110 which were not sufficiently proximate to photoresist 60 to be crosslinked or otherwise altered by substances diffusing from the photoresist. Remaining portions of material 110 form layers 112, 114, 116, 118, 120, 124, 126, 128, 130, 132 and 134 around the photoresist of features 70, 72, 74, 76, 78, 80, 82, 84, 86, 88 and 90.

The construction of FIG. 16 (i.e., the construction formed in accordance with a second embodiment of the invention) is shown to be identical to the construction of FIG. 12 (i.e., the construction formed in accordance with the first embodiment of the invention). However, it is to be understood that the processing of the second embodiment can lead to structures other than those accomplished by the processing of the first embodiment, and vice versa.

Although the first and second embodiments are shown forming layers which are uniform in thickness around the entirety of a block, such can be modified by choosing a dose of radiation which treats a block of photoresist differently along its elevational thickness. FIG. 17 shows an expanded view of construction 50 at a processing stage analogous to that of FIG. 16, but in accordance with an embodiment of the invention for forming a layer with a differing thickness at differing locations of the elevational height of the layer. The expanded view shows only features 78, 80 and 82.

The photoresist blocks 60 comprise top surfaces 61 and sidewall surfaces 63 extending from the top surfaces to the substrate 52. The sidewall surfaces have upper portions 65 proximate the top surfaces 61 and lower portions 67 below the upper portions (only some of the upper portions and lower portions are labeled). The exposure to the second actinic radiation 100 (FIGS. 8, 9 and 15) can be conducted so that upper portions of the photoresist blocks are exposed to more of the actinic radiation than are lower portions of the blocks (with the upper portions being elevationally coextensive with the upper portions of the sidewall surfaces, and the lower portions of blocks being elevationally coextensive with the lower portions of the sidewall surfaces). In particular aspects, the lower portions of the blocks are not exposed to any of the second actinic radiation.

In an exemplary aspect of the invention, the processing of FIG. 15 can be utilized, material 110 can comprise a composition which absorbs some of the actinic radiation 100, and the dose and wavelength of the actinic radiation can be chosen such that the radiation substantially only penetrates to the upper portions of the exposed photoresist features. The layers 120, 122 and 124 formed from material 110 are thicker over the upper portions of photoresist blocks 60 (i.e. are thicker over the portions which have been exposed to the actinic radiation 100) than over the lower portions of the photoresist blocks. In some aspects, the layer can be substantially nonexistent over the lower portions of the blocks, and in other aspects the layer can have a measurable thickness over the lower portions of the blocks (as shown). A measurable thickness can be, for example, a thickness of at least about 5 Å, and typically is at least about 50 Å.

The shown layers 120, 122 and 124 of FIG. 17 have a "bread loaf" appearance, which can significantly restrict the width of gaps 92 between adjacent structures 78 and 80, and between adjacent structures 80 and 82. Such can be desired in particular aspects of the invention, and can be particularly desired in aspects in which the layers 120, 122 and 124 are to be utilized in a lift-off process.

The processing described above with reference to FIGS. 4–16 shows that only some of the photoresist features over a substrate are exposed to the second dose of actinic radiation, and further, that an exposed feature can have only a portion exposed to the second actinic radiation while other portions of the feature are not exposed. It is to be understood, however, that the invention includes other aspects in which an entirety of a photoresist feature is exposed to second actinic radiation, as well as aspects in which all of the photoresist features over a semiconductor wafer substrate are exposed to the second actinic radiation. FIG. 18 shows construction 50 at a processing step similar to that of FIG. 12 or 16, but in which all of the features 70, 72, 74, 76, 78, 80, 82, 84, 86, 88 and 90 have been exposed to the second actinic radiation, so that all of the layers 112, 114, 116, 118, 120, 122, 124, 126, 128, 130 and 132 are uniformly thick.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a patterned composition over a substrate, comprising:
    providing a substrate having at least a pair of separated photoresist features thereover;
    exposing at least a portion of at least one of the separated photoresist features to actinic radiation to release a substance from the photoresist;
    forming a layer of material over the photoresist features and over a gap between the separated photoresist features, the material having a solubility in a solvent which is reduced when the material interacts with the substance released from the photoresist; and
    exposing the layer of material to the solvent to remove a portion of the material which is not proximate to the photoresist selectively relative to a portion of the material which is proximate to the photoresist.

2. The method of claim 1 wherein the photoresist is a chemically-amplified photoresist, and wherein the released substance is the chemical utilized for the chemical amplification.

3. The method of claim 1 wherein the exposure to the actinic radiation comprises exposure to a variable dose of the actinic radiation.

4. The method of claim 1 wherein only one of the separated photoresist features is exposed to the actinic radiation.

5. The method of claim 1 wherein only a portion of only one of the separated photoresist features is exposed to the actinic radiation.

6. The method of claim 1 wherein both of the separated photoresist features are exposed to the actinic radiation.

7. The method of claim 1 wherein both of the separated photoresist features are exposed to the actinic radiation, and wherein only a portion of both separated photoresist features is exposed to the actinic radiation.

8. The method of claim 1 wherein the exposure to the actinic radiation occurs after the forming of the material over the photoresist features.

9. The method of claim 1 wherein the exposure to the actinic radiation occurs prior to the forming of the material over the photoresist features.

10. The method of claim 1 wherein the substance released from the photoresist is a photogenerated acid.

11. A method of forming a patterned composition over a substrate, comprising:
    providing a substrate having photoresist thereover, the photoresist being in a pattern comprising at least a pair of physically separate features;
    exposing a region of the photoresist to actinic radiation to alter at least one property of the photoresist within the region;
    forming a layer of material over the features and over a gap between the features, the material having a solubility in a solvent which is reduced when the material is proximate to photoresist having the at least one altered property relative to when the material is not proximate to photoresist having the at least one altered property; and
    exposing the layer of material to the solvent to remove a portion of the material which is not proximate to the region of the photoresist selectively relative to a portion of the material which is proximate to the region of the photoresist.

12. The method of claim 11 wherein the exposure to the actinic radiation comprises exposure to a variable dose of the actinic radiation.

13. The method of claim 11 wherein the exposure to the actinic radiation occurs after the forming of the layer of material.

14. The method of claim 11 wherein the exposure to the actinic radiation occurs prior to the forming of the layer of material.

15. The method of claim 11 wherein the photoresist is a chemically-amplified photoresist, and wherein the at least one altered property of the photoresist includes release of the chemical utilized for the chemical amplification.

16. The method of claim 11 wherein:
    the photoresist is a chemically-amplified photoresist;
    the chemical utilized for the amplification is a photogenerated acid;
    the at least one altered property of the photoresist includes release of the photogenerated acid;
    the material and photoresist are subjected to a bake at a temperature from about 100° C. to about 120° C. to diffuse the photogenerated acid from the exposed region of the photoresist into the material; and
    the photogenerated acid induces crosslinks within the material.

17. The method of claim 11 wherein the photoresist is a positive photoresist.

18. The method of claim 11 wherein the photoresist is a negative photoresist.

19. A method of forming a patterned composition over a substrate, comprising:
photolithographically forming a plurality of discrete photoresist features over the substrate, the photoresist features being separated from one another by gaps;
exposing at least some of the discrete photoresist features to actinic radiation to release one or more substances from the photoresist of the discrete photoresist features;
forming a layer of material over the discrete photoresist features and over the gaps between the photoresist features, the material having a solubility in a solvent which is reduced when the material interacts with at least one of the substances released from the photoresist; and
exposing the layer of material to the solvent to remove portions of the material which do not contact the photoresist selectively relative to portions which do contact the photoresist.

20. The method of claim 19 wherein only some of the discrete photoresist features which are over the substrate are exposed to the actinic radiation.

21. The method of claim 19 wherein all of the discrete photoresist features which are over the substrate are exposed to the actinic radiation.

22. The method of claim 19 wherein the exposure to the actinic radiation occurs after the forming of the material over the discrete photoresist features.

23. The method of claim 19 wherein the exposure to the actinic radiation occurs prior to the forming of the material over the discrete photoresist features.

24. The method of claim 19 wherein the at least one substance released from the photoresist and which interacts with the material is a proton of a photogenerated acid.

25. A method of forming a patterned composition over a substrate, comprising:
forming photoresist over the substrate;
subjecting the photoresist to patterned first actinic radiation to render a first region of the photoresist more soluble in a first solvent than a second region;
utilizing the first solvent to remove the first region of the photoresist while leaving the second region;
exposing at least some of the second region to second actinic radiation; the photoresist of the second region which is exposed to the second actinic radiation releasing a substance;
forming a material over the second region of the photoresist, the material being rendered less soluble in a second solvent through interaction with the substance; and
utilizing the second solvent to selectively remove a portion of the material which is not proximate to the photoresist that was exposed to the second actinic radiation relative to a portion of the material which is proximate to the photoresist that was exposed to the second actinic radiation.

26. The method of claim 25 wherein:
the second region of photoresist remaining after removal of the first region of photoresist comprises a plurality of discrete features;
only some of the discrete features are exposed to the second actinic radiation, the features exposed to the second actinic radiation being first features and the features not exposed to the second actinic radiation being second features; and
the material remaining after the exposure to the second solvent forms layers around all of the discrete features, with the layers being thicker over the first features than over the second features.

27. The method of claim 26 wherein the layers of the remaining material around the discrete features comprise chemical crosslinking therein.

28. The method of claim 26 wherein the second features have portions exposed to the second actinic radiation and portions not exposed to the second actinic radiation, and wherein the material remaining after the exposure to the second solvent is thicker over the portions of the second features exposed to the second actinic radiation than over portions of the second features that are not exposed to the second actinic radiation.

29. The method of claim 25 wherein only some of the second region is exposed to the second actinic radiation.

30. The method of claim 25 wherein all of the second region is exposed to the second actinic radiation.

31. The method of claim 25 wherein the exposure to the second actinic radiation occurs after the forming of the material.

32. The method of claim 25 wherein the exposure to the second actinic radiation occurs prior to the forming of the material.

33. The method of claim 25 wherein the substance released from the photoresist is a proton of a photogenerated acid.

34. The method of claim 25 wherein the photoresist is a positive photoresist.

35. The method of claim 25 wherein the photoresist is a negative photoresist.

36. The method of claim 25 wherein the second region comprises photoresist blocks having top surfaces and sidewall surfaces extending from the top surfaces to the substrate; wherein the blocks have upper portions proximate the top surfaces and lower portions beneath the upper portions; wherein the upper portions of the photoresist blocks are exposed to more of the second actinic radiation than lower portions; and wherein the material remaining after utilization of the second solvent is thicker on the top surfaces of the blocks and upper portions of the sidewall surfaces than along lower portions of the sidewall surfaces.

37. The method of claim 36 wherein the lower portions of the sidewall surfaces are not exposed to any of the second actinic radiation.

38. The method of claim 36 wherein a measurable thickness of the material remains on the lower portions of the sidewall surfaces after the utilization of the second solvent.

39. The method of claim 36 wherein the exposure to the second actinic radiation occurs after forming the material.

40. The method of claim 25 wherein the first actinic radiation induces some release of the substance and the second actinic radiation induces additional release of the substance.

41. The method of claim 25 wherein the first actinic radiation is light having a primary wavelength, and the second actinic radiation is light having the same primary wavelength as the first radiation.

42. The method of claim 25 wherein the first actinic radiation is light having a primary wavelength, and the second actinic radiation is light having a different primary wavelength than the first radiation.

43. The method of claim 25 wherein the first actinic radiation is provided to a first dose, and wherein the second actinic radiation is provided to a second dose different than the first dose.

44. The method of claim 25 wherein:

only some of the second region is exposed to the second actinic radiation;

the first actinic radiation induces some release of the substance and the second actinic radiation induces additional release of the substance;

the material remaining after the exposure to second solvent is a first thickness over portions of the second region which are not exposed to the second actinic radiation and is a second thickness over portions of the second region which have been exposed to the second actinic radiation;

the first thickness is greater than about 50 Å; and the second thickness is greater than the first thickness.

* * * * *